United States Patent [19]

Venier

[11] Patent Number: 4,633,426
[45] Date of Patent: Dec. 30, 1986

[54] METHOD AND APPARATUS FOR DETECTING A BINARY CONVOLUTED CODED SIGNAL

[75] Inventor: Gerald O. Venier, Kanata, Canada

[73] Assignee: Her Majesty the Queen in right of Canada, Ottawa, Canada

[21] Appl. No.: 646,454

[22] Filed: Aug. 31, 1984

Related U.S. Application Data

[63] Continuation-in-part of Ser. No. 295,369, Aug. 24, 1981, abandoned.

[30] Foreign Application Priority Data

Aug. 27, 1980 [CA] Canada .................................. 359107

[51] Int. Cl.$^4$ ..................... H03H 17/04; G06F 15/336; H03D 1/00
[52] U.S. Cl. ..................................... 364/724; 333/132; 364/825; 375/96
[58] Field of Search ................ 364/724, 728, 825, 861, 364/862; 333/18, 132; 375/94, 95, 96

[56] References Cited

U.S. PATENT DOCUMENTS

| | | | |
|---|---|---|---|
| 2,124,599 | 7/1938 | Wiener et al. | 333/132 |
| 3,270,188 | 8/1966 | Ares | 364/824 |
| 3,624,562 | 11/1971 | Fujimura | 333/18 |
| 3,631,232 | 12/1971 | Perreault et al. | 364/862 X |
| 3,818,348 | 6/1974 | Puente | 364/728 X |
| 3,890,618 | 6/1975 | Speiser | 364/825 X |
| 3,899,666 | 8/1975 | Bolger | 364/861 X |
| 3,997,973 | 12/1976 | Buss | 364/825 X |
| 4,088,960 | 5/1978 | Osborne | 375/96 |
| 4,100,378 | 7/1978 | Claasen et al. | 375/96 X |
| 4,120,035 | 10/1978 | Cases et al. | 364/825 X |
| 4,243,958 | 1/1981 | Wilde | 364/825 X |
| 4,264,983 | 4/1981 | Miller | 364/825 |
| 4,412,301 | 10/1983 | Strubeck | 364/728 |

*Primary Examiner*—Felix D. Gruber
*Attorney, Agent, or Firm*—Stevens, Davis, Miller & Mosher

[57] ABSTRACT

A method and apparatus are disclosed for detecting, in a plurality of stages of a matched filter, a binary convoluted coded signal having a plurality of code levels ranging from a low level, high repetition rate code to a high level, low repetition rate code, in which each filter stage of the matched filter is used to store elements of the convoluted coded signal in a memory such as a tapped delay line. The stored code is then tapped at intervals defined by the convoluted code to obtain a set of samples. The samples are then multiplied, each with a polarity coefficient determined by the convoluted code level at the tap locations resulting in translated samples. The samples are then summed in an adder to obtain an output signal. The output is connected to the input of the memory of a next filter stage of the matched filter and the sequence is continued for all the code levels in the signal.

14 Claims, 6 Drawing Figures

CODE C  + − + + − − − + + − + −
CODE B  + + + + + − − + + − − +
CODE A  + + + + + − − + + − + +
FIG. 1
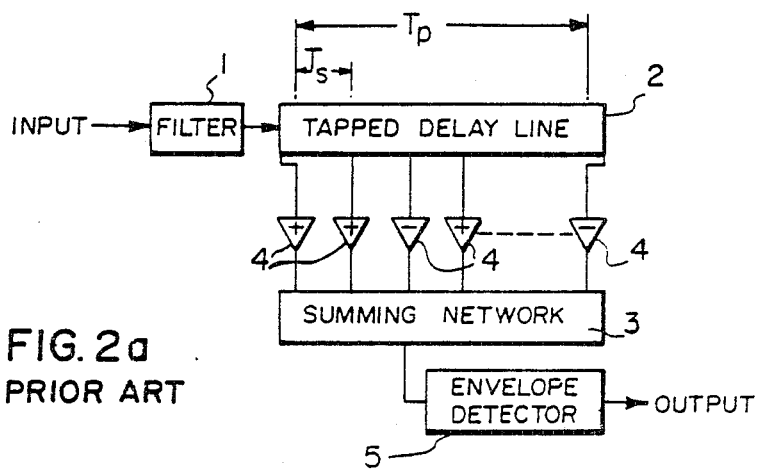
FIG. 2a
PRIOR ART
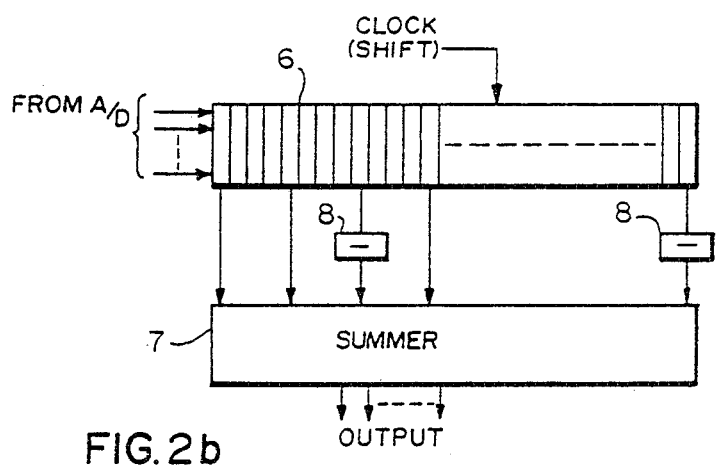
FIG. 2b
PRIOR ART

METHOD AND APPARATUS FOR DETECTING A BINARY CONVOLUTED CODED SIGNAL

The present application is a continuation-in-part of U.S. application Ser. No. 295,369 filed Aug. 24, 1981 now abandoned.

FIELD OF THE INVENTION

This invention relates to an electronic matched filter and particularly to a matched filter for detecting a binary convoluted coded signal.

SUMMARY OF THE INVENTION

Matched filters for detecting signals of known wave-shape are extensively used in sounding or ranging systems. The present invention is a matched filter for use in a system in which the known wave-shape is of a particular type — a binary convoluted code. Binary convoluted codes are especially useful to obtain large time-bandwidth products, which provide certain advantages as will be noted below. In sounding or ranging systems, the signal-to-noise ratio achieved in a receiver is proportional to the energy in the received pulse. Further, the resolution capability of the received waveform depends on the inverse of its bandwidth. Bandwidth can be made much greater than the inverse of pulse length if modulation is used within the pulse. Accordingly a waveform much longer than the desired resolution can be used to increase the signal energy. The resulting signal has a time-bandwidth product greater than unity. It is thus desirable to transmit a signal having a large time-bandwidth product which allows reduction of the peak power and increases the probability of detection assuming that a matched filter in an optimum receiver is used. High peak power is of course undesirable because it increases transmitter cost, and causes interference to other users.

The bandwidth of a long pulse can be increased by dividing it into a number of segments or sub-pulses and by changing the phase from sub-pulse to sub-pulse, resulting in a discrete phase modulation. Although the phases can be selected from any number of possible values, the use of only two possible phases separated by 180° has considerable advantage and simplicity. Where the spectrum of the waveform has a general sine x/x shape of that of the individual sub-pulses, the bandwidth of the individual pulses is equal to the inverse of the sub-pulse length, and the resulting time-bandwidth product will be equal to the number of sub-pulses. Clearly it is advantageous to have the maximum possible number of sub-pulses; the convoluted code is a form of code which provides a very great number of sub-pulses.

In a convoluted code, each sub-pulse of a high order or main Code is made up of a complete lower ordered code sequence, which is repeated for each sub-pulse, the code sequence being inverted in phase where the higher ordered sub-pulse inverts its phase. The lower ordered code can have each of its sub-pulses made up of a complete still lower ordered code sequence, in the same manner. In this way many codes can be nested within each other, clearly increasing the number of sub-pulses and thus the time-bandwidth product.

The sidelobe ratio of a binary-phase-coded waveform depends on the particular sequence of phases which is in the code. The best possible code would have a sidelobe ratio equal to the number of sub-pulses. Codes having this property, known as Barker codes have been found for the time-bandwidth products, i.e., the number of sub-pulses, equal to 2, 3, 4, 5, 7, 11 and 13. However longer codes can be selected from pseudo-random sequences, which have generally good sidelobe ratios.

In order to realize the resolution capability of the received waveform, it is correlated with the expected signal, i.e., the transmitted waveform. This is performed by multiplying the received and reference signals and integrating the result over a period of the reference signal. If this is done for a large number of delayed versions of the received signal a set of output correlations will be the samples of the correlation function at those delays. However, this is not often used because for a reasonable number of correlation outputs, a large number of multipliers and integrators are required. This requirement can be reduced to a single multiplier and integrator if the correlations are carried out sequentially. This can be accomplished by storing the signal, e.g., in a charge coupled delay line, and recirculating it at a slightly different rate from that of the reference to permit the two signals to slide past each other. Only one correlation output can be obtained for each recirculation of the signal. Thus to produce the complete correlation function, the time required will be at least TW times the signal duration. This time can be reduced by speeding up the recirculation rate, but then the speed of the multipliers would be increased by the same factor.

Another technique for performing the correlation utilizes a matched filter, in which a reference waveform is stored in the filter itself in the form of its impulse response or frequency response. Since the output of a filter is the convolution of its input and impulse response, and since correlation and convolution differ only in the direction of the time scale, the desired correlation is produced by making the impulse response the time reverse of the reference signal. In the frequency domain, such a filter has a response which is the complex conjugate of that of the reference waveform.

The matched filter can be implemented by time-domain or frequency-domain design. In the time-domain, the matched filter can be a tapped delay line where the tapped outputs are weighted and summed to provide the output. The tapped weights are sampled versions of the desired impulse response (the time reverse of the transmitted waveform). The taps must be close enough together to accommodate the signal, i.e., the time separation must be less than ½ the inverse of the signal bandwidth.

Detection of the signal can also be performed digitally, which requires sampling and analog-to-digital conversion. To keep sampling rates to a minimum, digital processors are often designed to operate on complex representations of the signal heterodyned down to zero center frequency. The negative frequencies are independent of the positive ones, so that, for example, a 10 khz signal can be contained in the range −5 khz to +5 khz and the theoretical minimum sampling rate is 10 khz.

In all of the aforenoted forms, the matched filter or storage means receives the complete signal, and with the correlation technique described above, the matched filters required for large time-bandwidth products (e.g. 1000 or more) is very complex. Either a large number of components are required, or very high speed components are required to reduce the number by performing some of the operations sequentially.

The present invention is a matched filter for a binary convoluted coded signal which allows matched filter processing to be carried out in a more efficient manner than that using a straightforward transversal filter configuration. The present filter can be implemented either as a digital or an analog device, the latter form using, for example, charge-coupled devices for delay lines. The structure can also be implemented in a microprocessor. Advantages of the present invention will become evident in the detailed description below of the preferred embodiment of the invention.

Since the sub-pulse shape is known (preferably being a simple pulse of sine wave), an economy can be made in the filter since a filter matched to the wave shape of each sub-pulse can be connected ahead of the storage means. Where the storage means is a tapped delay line, its length is made equal to the total waveform code length minus one sub-pulse length, and is tapped at intervals of the sub-pulse. Where the storage means is a digital device such as a shift register, the sub-pulse matched filter preferably should be an analog device, followed by an analog-to-digital converter.

However, it will be clear that for a complex convoluted code filter, in order to provide a large time bandwidth (TW) value, the length of the delay line or shift register would be extremely long, and thus would still be extremely complex and costly.

The present invention achieves substantial economy, since far fewer arithmetic operations are required in comparison to prior art matched filters for binary phase convoluted coded signals, as will become evident in the detailed description below. This can lead to the requirement for a reduced number of components.

According to one embodiment of the invention, there is provided a matched filter, having a plurality of filter stages, for processing a binary convoluted code having a plurality of code levels ranging from a low level, high repetition rate code to a high level, low repetition rate code, said filter stages comprising:
  a. means for storing the elements of a convoluted coded input signal;
  b. means for tapping the stored elements at intervals defined by a specified convoluted code level to obtain a set of samples,
  c. means for multiplying the samples, each with a polarity coefficient corresponding to the polarity of a related convoluted code element to obtain translated samples;
  d. means for summing the translated samples to obtain an output signal, said summing means being connected to the input of the storing means of a next filter stage.

Another embodiment of the invention is a method of detecting, in a plurality of stages, a convoluted coded signal having a plurality of code levels ranging from a low level, high repetition rate code to a high level, low repetition rate code comprising the steps of:
  a. storing the elements of the convoluted coded signal;
  b. tapping the stored elements at intervals defined by a specified convoluted code level to obtain a set of samples;
  c. multiplying the samples, each with a polarity coefficient determined by the polarity of a related convoluted code element to obtain translated samples;
  d. summing the translated samples to obtain an output signal;
  e. carrying the output signal to the input of a next filter stage.

More generally, the invention is a matched filter for a binary convoluted code having code levels ranging from a low level, high repetition rate code to a high level, low repetition rate code, comprising a plurality of filter stages for processing at a first stage, a binary phase coded signal corresponding to a high level, low repetition rate code, at a second stage, a binary phase coded signal corresponding to a low level, high repetition rate code having its input connected to the output of the second stage, and means for carrying an output signal at the output of said last filter stage.

BRIEF DESCRIPTION OF THE DRAWINGS

A better understanding of the invention will be obtained by reference to the detailed description below, and the following drawings, in which:

FIG. 1 illustrates the form of a convoluted code.

FIG. 2A and 2B show analog and digital forms of prior art matched filters.

DETAILED DISCUSSION OF THE INVENTION

Figure 3:
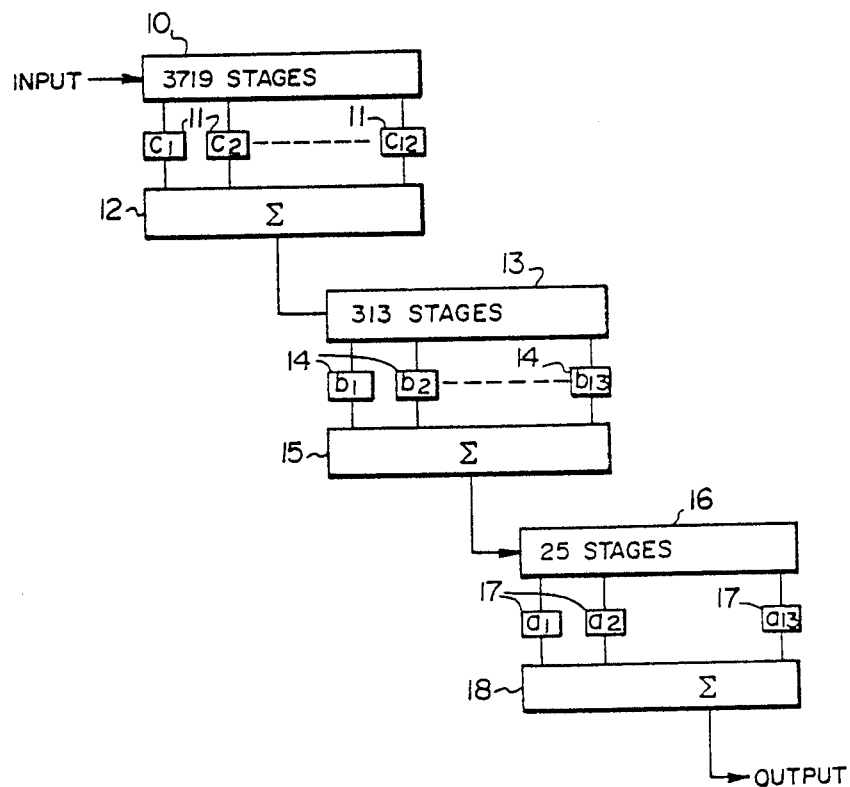
FIG. 3 is an analog/digital delay line implementation for non-complex signals.

FIG. 1 is a representation of a binary phase convoluted code having three levels. When this code is applied to a signal the + and − signs can represent phase modulation by 0 and 180 degrees respectively of sine wave carrier.

The sequence shown as code C we will refer to as a high level, low repetition rate code. In the convoluted code form, each of the binary elements of code C is made up of entire code sequence such as code B. For each binary element represented by + in code C, the entire code sequence of code B is inserted. For each − binary position in code C, the entire code sequence B is inserted, but with opposite phase.

Further, for each binary + element of code B, the entire sequence of code A is inserted. For every − element of code B, the entire sequence of code A is inserted, but with opposite phase.

In this manner, codes are nested within codes, and it is clear that the code sequences range from a high level, low repetition rate code to a low level, high repetition rate code. In the three level code sequence example shown in FIG. 1, code C is defined as a high level, low repetition rate code while code B is defined as a low level, high repetition rate code. Code A is a lower level, higher repetition rate code.

FIG. 2A shows the analog form of a matched filter for detection of a binary phase coded signal such as a convoluted coded signal according to the prior art.

An analog matched filter 1 matched to the sub-pulse waveform is connected to receive the input signal on the INPUT lead. Filter 1 should have a frequency response matched to the spectrum of a simple pulse of sine wave whose duration is the sub-pulse length $T_s$. A simple two-stage synchronously-tuned circuit with 6 dB bandwidth equal to that of the sub-pulse shape will provide satisfactory performance.

The output signal from filter 1 is applied to the input of tapped delay line 2, which has a length equal to the total waveform length $T_p$, less one sub-pulse length $T_s$. The delay line is tapped at intervals of $T_s$.

The tap outputs are summed in a summing network 3 with or without phase reversal depending on the binary code element of the transmitted waveform for that sub-pulse. Phase reversals or translations without phase reversal are provided in amplifiers 4 (which show phase reversal with a − sign, and no phase reversal with a + sign).

The output of the summing network 3 is applied to envelope detector 5, which applies its output signal to the OUTPUT lead.

For the code shown in FIG. 1, having 12 elements in code C and 13 elements in each of codes A and B, the number of taps required is 12×13×13, or 2,028. The summing network is obviously highly complex and expensive.

FIG. 2B shows a digital form of prior art matched filter. An analog sub-pulse matched filter as described with reference to FIG. 2A is utilized prior to the digital filter, followed by an analog-to-digital converter (not shown). In the time domain, the digital matched filter can, in one embodiment, take the form of a shift register 6 having a number of stages (equal to the number of elements in the code minus one) times the number of samples per code element (sub-pulse) plus one. The input from the A/D converter is in the form of digital words representing samples of analog signal at times determined by the system clock. The number of bits in each word depends on the required amplitude resolution, but can be, for example, 8 bit words. These words are fed into an 8 bit word shift register (this may be 8 parallel shifter registers, 1 for each bit), which is shown as a single shift register 6. The bits are shifted once each clock period and the 8 bits are brought out at stages separated in time by the sub-pulse length. The outputs are applied to summer 7, where they are summed, those corresponding to the negative parts of the code being first complemented in complementing amplifiers 8. The output of summer 7 forms an output word, one output being produced for each input.

It should be noted that no multiplications are required, only additions and subtractions. Thus simple microprocessors can be used to form the system. However, for simple microprocessors, processing time has been found to be relatively long.

In the example of FIG. 2B, taps are located only at every fourth stage. Thus there must be four clock pulses per sub-pulse, and there are four output samples per sub-pulse, which allows for a good representation of the matched filter output. For some applications two samples per sub-pulse may be sufficient, or even as few as one.

When the functions of FIG. 2B are carried out in a computer, the sampled and digitized signal is read into memory and instead of the signal being shifted, the taps are shifted by means of address incrementing. For each output word the words corresponding to each of the taps are either added to or subtracted from an accumulating sum depending on the code or that tap. After all of the tap values have been summed to provide one output, each of the addresses is incremented to effect the shifting operation and the next output is computed. For a code length TW there are TW taps and therefore for each output TW operation consisting of a memory access, an addition or substraction is required.

If there are $N_s$ samples per sub-pulse and we wish to look at the output for $N_r$ resolution cells (sub-pulse lengths), then the number of operations required for one filter is $N_r \times N_s \times TW$. Since two such filters are actually required, one for the real and the other for the imaginary channel (the latter can be eliminated if the filter is implemented for a real bandpass signal, but in that case a higher sample rate would be required), the total number of operations for display of $N_r$ resolution cells is $2N_r \times N_s \times TW$.

Consider as an example a high frequency sounding system in which TW equals 2000, the resolution is 100 microseconds, the delay window (i.e. the delay range to be examined) is 5 ms, and the time between the output display sweeps is 1 second. Then $N_r$ equals $5 \times 10-3/100 \times 10-6 = 50$. For Ns equal to 2 samples per resolution cell the number of operations required in one second is $2 \times 50 \times 2 \times 2,000 = 400,000$. This means that an operation would have to be performed in 2.5 microseconds or less. This would not appear to be possible in a low-cost microcomputer but would be possible in a more sophisticated system.

It has been found that the number of operations required for a time-domain implementation can be reduced substantially where the circuit of the form of FIG. 3 is used. This diagram illustrates detection of a three-level binary convoluted code with a length of 2,028 (which length was chosen for illustration purposes for comparison with the previous example). The code is of the form of FIG. 1, in which the low level, high repetition rate code is used for each element of code B, which itself is used for each element of high level, low repetition rate code C. The length of the code is clearly the product of the number of elements in each code, $12 \times 13 \times 13 = 2,028$.

A sub-pulse length of 100 microseconds and 2 samples per sub-pulse are assumed for comparison with the previous example.

According to the present invention, shown in FIG. 3, the processing is done in stages each forming a matched filter to exploit the pattern in the convoluted code. The blocks $a_1-a_{13}$, $b_1-b_{13}$, and $c_1-c_{12}$ are the binary coefficients representative of the specific code elements at the element positions, and can be inverting or non-inverting amplifiers, depending on the required coefficient.

The analog input signal is first filtered as described with reference to prior art FIG. 2A, to match the sub-pulse spectrum and to avoid aliasing. The filtered input signal is then sampled and applied to the input of shift register 10. The sampling rate should be at least the Nyguist rate. The number of segments between taps of shift register 10 is one less than the code length. Since the code length of code C is 12 elements, the total number of stages is 11 times the number of elements in code B, times the number of elements in code A times the number of samples per sub-pulse plus one, or $(11 \times 13 \times 13 \times 2) + 1 = 3,719$ stages.

Shift register 10 is tapped at 12 taps corresponding to the intervals defined by the high level code, the tap outputs which provide samples of the stored code at intervals defined by the high level code being translated through coefficient amplifiers 11 to the inputs of summer 12. The translation or inversion of the coefficient amplifiers respectively match the phase of the individual elements of code C, the last coefficient amplifier matching the phase or polarity of the first element of code C, etc. The circuit from the input to summer 12 forms a matched filter stage.

The output of summer 12 is connected to the input of a second shift register 13. This shift register contains a number of stages equal to the number of elements of code B minus one, times the number of elements of code A, times 2 (the number of samples per sub-pulse) plus one or $(12\times13\times2)+1=313$ stages.

Shift register 13 is tapped at 13 points, the number of code elements of the second code level, and the taps which provide samples of the code stored in register 13 at the intervals of the second level code are connected through coefficient amplifiers 14, the outputs of which are connected to the inputs of summer 15. As with coefficient amplifiers 11, the translation or inversion of coefficient amplifiers 14 match the phase or polarity of the individual elements of code B, translating without phase inversion for the + code elements and with phase inversion for the − code elements. The circuitry from the output of summer 12 to the output of summer 15 forms another matched filter stage.

The output of summer 15 is connected to the input of shift register 16. This shift register has one more stage than the number of elements in code A minus one, times 2 (samples per sub-pulse), or $(12\times2)+1=25$ stages. This shift register is tapped at 13 tap points, the number of code elements in lowest level code A. These tap points, which provide samples of the code stored in register 16 at the intervals of the lowest level code are connected through coefficient amplifiers 17, which translate the individual tapped signals with phase translation or inversion matching the phase or polarity of the individual code elements of code A. The outputs of coefficient amplifiers 17 are connected to summing inputs of summer 18. The output of summer 18 provides the output signal from the matched filter, for the three level code. The circuitry from the output of summer 15 to the output of summer 18 forms yet another matched filter. For different numbers of code levels, of course the number of stages of the system would correspond in a manner similar to that described above.

In operation, the signal is filtered in the sub-pulse filter (not shown in FIG. 3), is sampled and is then applied to the input of shift register 10. The signal fills shift register 10, advancing past the tap points to which coefficient amplifiers 11 are connected. As the signal passes through shift register 10, individual code elements are tapped off and applied to summer 12. Accordingly when there is a match of the 12 code elements of code C to the inversion or translation coefficient of amplifiers $C_1-C_{12}$, a high level output appears at the summer 12 output, and is applied to the input of shift register 13.

As the code elements pass through shift register 13 and are translated via coefficient amplifiers 17 to summing amplifier 15, a match of code B occurs, and a high level signal is output from summer 15 to the input of shift register 16.

In a similar manner, element samples applied to the input of shift register 16 are sampled at 13 tap points and are translated through coefficient amplifiers 17 which match the phase or polarity of code A. When a match occurs, the output of summer 18 is high and a high level output is provided.

Clearly the highest level output from summer 18 occurs when there is a match in all three of the individual shift register-summer stages.

The shift registers can be in the form of an analog tapped delay line (e.g. charge coupled devices) of either continuous or discrete-time variety as described with reference to FIG. 2A or the digital shift register described with reference to FIG. 2B. In the latter case, an analog-to-digital conversion would of course be performed prior to application of the input signal to the first shift register 10.

It should be noted that the total number of shift register stages is $3,719+313+25=4,057$, which is twice the code length. This is the same number that would be required for the direct implementation shown in FIG. 2B, for two samples per sub-pulse. However while the implementation of FIG. 2B requires 2,028 summing operations for each output, that of FIG. 3 requires only 38, a reduction by a factor of about 53, which substantially reduces the complexity and results in a more economical circuit. Of course the actual reduction would not be as great since additional operations must be performed to fill shift registers A and B. For each input to register 13, twelve operations are required on the tapped signals of shift register 10. Thus to fill register 13 requires $313\times12=3,756$ operations.

After register 13 is full, then for each input to register 16, $12+13=25$ operations are required on tapped signals of registers 10 and 13. That is, $25\times25=625$ operations are required to fill register 16. Thus a total of $3,756+625=4,381$ operations are required before any results are started to be received, assuming two samples per sub-pulse. In general, if there are $N_s$ samples per sub-pulse, $(2,172\times N_s)+37$ operations are required. This constitutes the overhead to the system.

If an output display window covering $N_r$ resolution elements in delay (sub-pulse lengths) is required, then $N_s\times N_r$ outputs must be generated. Thus the total number of pperations, including overhead, to display $N_r$ resolution elements is $(38\times N_s\times N_r+2,172\times N_s)+37$.

For the parameters used for the prior art embodiment, where the resolution is 100 microseconds, a delay window of 5 ms. and a time between output sweeps of 1 second was desired, $N_r=5\times10^{-3}/100\times10^{-6}=50$. For $N_s=2$ samples per sub-pulse as before, the number of operations required in the 1 second period for 1 filter is $(38\times2\times50)+4381=8181$. Since two filters are required, one for the real and one for the imaginary portion of the signals, 16,362 operations are required for the system. An operation thus would have to be performed in less than 61 microseconds.

Figure 4:
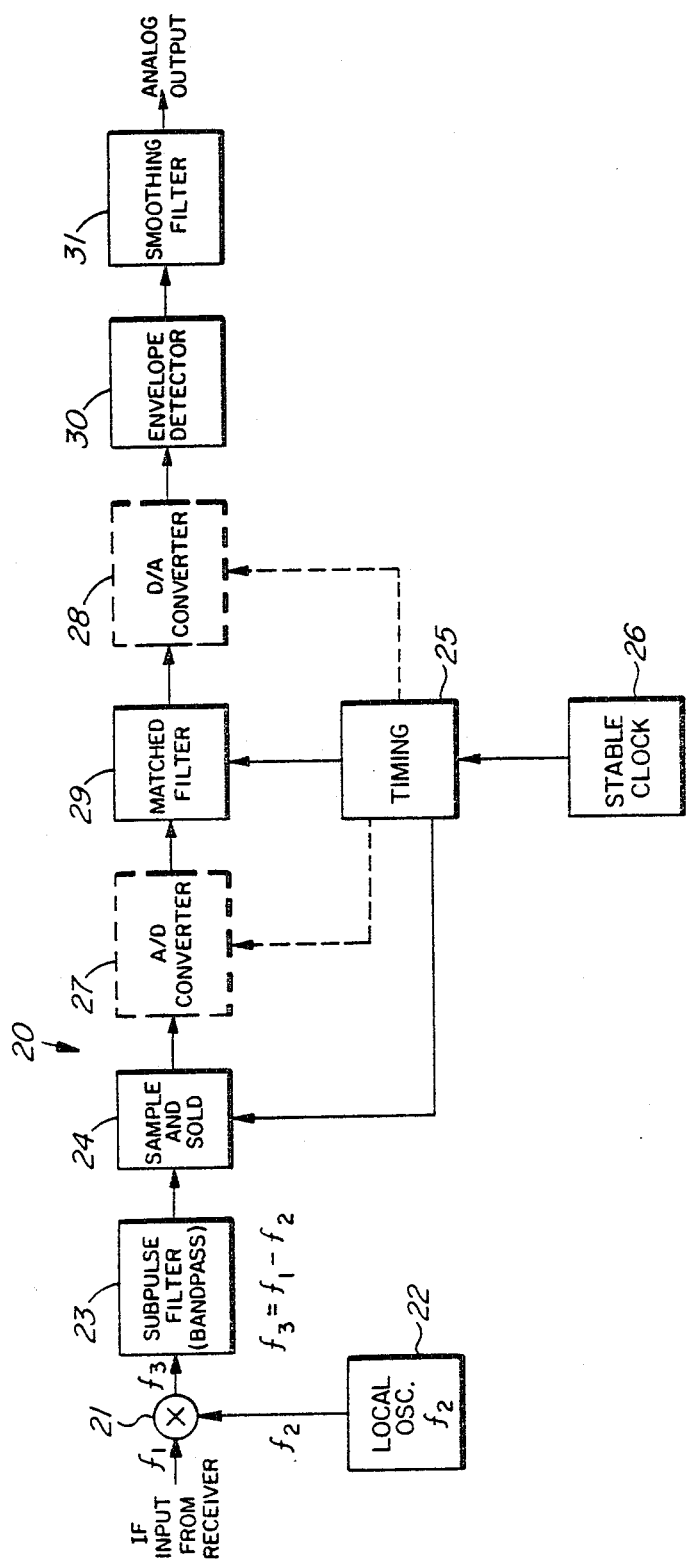
FIG. 4 is an analog/digital delay line implementation for complex signals.

FIG. 4 is a block diagram showing a typical matched filter implementation 20 for processing the real portion of a signal. The filter can be implemented in either analog or digital form.

The IF input frequency f1 from a receiver (not shown) is multiplied at 21 with a local oscillator 22 at frequency f2. The resulting frequency f3 is then filtered by bandpass filter 23 to retain the lower portion of the spectrum f1-f2.

The filtered signal is then sampled and held at 24 until it is released by timing control 25 which is itself controlled by clock 26. If the digital delay line implementation of the matched filter is used, then A/D and D/A converters 27 and 28 are used before and after the matched filter 29 as is indicated by the dotted lines in FIG. 4. An envelope detector 30 is used to remove the carrier present with the signal. A smoothing filter 31 is used at the output to remove any possible high frequency component that may exist on the signal.

Figure 5:
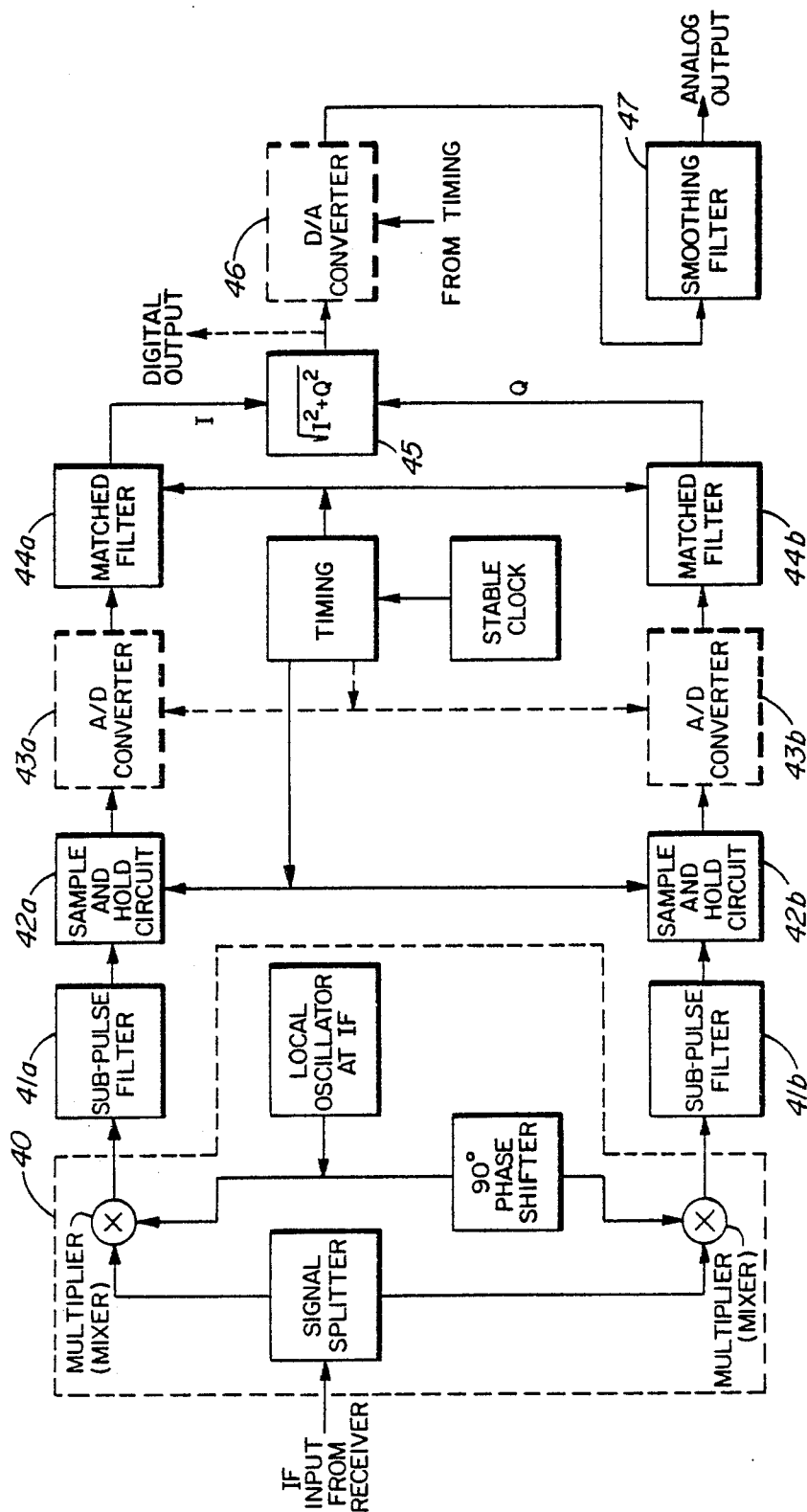
FIG. 5 shows an embodiment of a method and apparatus according to the present invention.

A known method of implementing a matched filter for having an IF signal to a digital complex representation is illustrated in FIG. 5. For a complex signal, the in-phase and quadrature components are separated, as shown at 40, such as by mixing the input signal separately with a local oscillator signal and a similar local oscillator signal shifted in phase by 90 degrees. The resulting separated components are then low pass filtered at 41a and 41b, sampled and held at 42a and 42b. Depending on whether a digital matched filter is used, A/D converters 43a and 43b can be added to convert the analog signal to digital signals. The signals are then processed separately in matched filters 44a and 44b as described above. The output signals are then combined at 45 to obtain a complex output signal, e.g., by obtaining the square root of the sum of the squares of the two output signals.

A D/A converter 46 can be used if required to convert the digital signal back to analog form.

The signal can then be filtered at 47 before reaching output.

The matched filter can be implemented using the structural form described, or in a microcomputer. In the latter form, one or two bytes is accessed representing the signal, added to a data word in a random access memory consisting of about 3 bytes and then the word is stored back in memory. In an 8 bit microcomputer, less then 35 cycles is required, and much less in a 16 bit microcomputer. Since the cycle time typically is less than one microsecond, the operations can easily be carried out in real time, although extra time must be considered for controlling loops and computing magnitude, but the latter operations occur at a much lower rate and do not significantly increase the computing load. Thus even a very simple 8 bit microcomputer is adequate.

For example, the given total microcomputer memory required is just under 10,000 words.

It is preferred that one or more of the codes which are used should be a 13 bit Barker code, which has a very good sidelobe ratio for its size and has been found to be adequate for a high frequency sounding application.

While a filter for matching a three level convoluted code has been described, it is not intended that the invention should be limited to a three level code. Fewer, or more stages can be used and interconnected in a similar manner to that shown in FIG. 3 and described above; the number of stages in each shift register is determined as noted in the above description.

The present invention thus provides means for utilizing in an efficient manner binary phase convoluted coded signals having large TW values. Thus a very low peak transmitted power can be utilized without sacrificing good delay resolution. Interference problems can thus be minimized economically, and ancillary equipment such as the power amplifier, etc., can be simplified.

Further, the structure can be either of analog or digital processing type, although the digital form is preferred since it can be implemented by a microprocessor-based system. The use of a convoluted code also permits information to be transmitted at the same time that ionospheric sounding is performed.

A person skilled in the art understanding this invention may now conceive of variations or other embodiments, using the principles described. All are considered within the sphere and scope of the present invention, as defined in the claims appended hereto.

The embodiments of the invention in which an exclusive property or privilege is claimed are defined as follows:

1. A matched filter, having a plurality of filter stages, for processing a binary convoluted code having a plurality of code levels ranging from a low level, high repetition rate code to a high level, low repetition rate code, said filter stages comprising:
   a. means for storing the elements of a convoluted coded input signal;
   b. means for tapping the stored elements at intervals defined by a specified convoluted code level to obtain a set of samples;
   c. means for multiplying the samples, each with a polarity coefficient corresponding to the polarity of a related convoluted code element to obtain translated samples;
   d. means for summing the translated samples to obtain an output signal, said summing means being connected to the input of the storing means of a next filter stage.

2. A matched filter as defined in claim 1, wherein said filter stages comprise a first filter stage for processing a binary phase coded signal corresponding to the high level, low repetition rate code and a second filter stage for processing a binary phase coded signal corresponding to the low level, high repetition rate code and having its input connected to the output of the first stage.

3. A matched filter as defined in claim 2 further comprising a third filter stage for processing a binary phase coded signal corresponding to a lower level, higher repetition rate code having its input connected to the output of the second stage.

4. A matched filter as defined in claim 1 in which the storing means are each analog shift registers.

5. A matched filter as defined in claim 4 in which each shift register is a charge coupled device.

6. A matched filter as defined in claim 1 in which each of the storing means is comprised of a tapped delay line.

7. A matched filter as defined in claim 1 in which each of the storing means is comprised of a digital shift register.

8. A matched filter as defined in claim 1, in which the tapping means is adapted to provide quantized representations of said samples with predetermined resolution.

9. A matched filter as defined in claim 8, in which the storing means are comprised of a random access memory adapted to store binary bits of digital words representing the quantized representations of said samples.

10. A matched filter for a binary convoluted code having code levels ranging from a low level, high repetition rate code to a high level, low repetition rate code, comprising a plurality of filter stages for processing at a first stage, a binary phase coded signal corresponding to a high level, low repetition rate code, at a second stage, a binary phase coded signal corresponding to a low level, high repetition rate code and, at a last stage, a binary phase coded signal corresponding to a lower level, higher repetition rate code having its input connected to the output of the second stage, and means for carrying an output signal at the output of said last filter stage.

11. A matched filter as defined in claim 10, in which each of said filter stages are comprised of digital shift registers, each adapted to store elements of a corresponding code level in parallel binary code.

12. A matched filter as defined in claim 10, in which each of said filter stages are comprised of delay lines each adapted to store the elements of a corresponding code level, less one element of that code level.

13. A method of detecting, in a plurality of stages, a convoluted coded signal having a plurality of code levels ranging from a low level, high repetition rate code to a high level, low repetition rate code comprising the steps of:
  a. storing the elements of the convoluted coded signal,
  b. tapping the stored elements at intervals defined by a specified convoluted code level to obtain a set of samples,
  c. multiplying the samples, each with a polarity coefficient determined by the polarity of a related convoluted code element to obtain translated samples,
  d. summing the translated samples to obtain an output signal,
  e. carrying the output signal to the input of a next filter stage.

14. A method of detecting, in a plurality of stages, a convoluted coded signal having a plurality of code levels ranging from a low level, high repetition rate code to a high level, low repetition rate code comprising the steps of:
  a. separating in-phase and quadrature components of a convoluted coded signal,
  b. separately storing the elements of the components of the convoluted coded signals,
  c. tapping the stored elements at intervals defined by a specified convoluted code level to obtain two sets of samples,
  d. multiplying the samples, each with a polarity coefficient determined by the polarity of a related convoluted code element to obtain two sets of translated samples,
  e. separately summing the two sets of translated samples to obtain output signals, and
  f. combining the sums to obtain a complex output signal.

* * * * *